United States Patent
Park et al.

(10) Patent No.: US 7,473,513 B1
(45) Date of Patent: *Jan. 6, 2009

(54) PHOTOSENSITIVE METAL NANOPARTICLE AND METHOD OF FORMING CONDUCTIVE PATTERN USING THE SAME

(75) Inventors: Jong Jin Park, Guri-shi (KR); Eun Jeong Jeong, Yuseong-gu (KR); Sang Yoon Lee, Seocho-gu (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/505,324

(22) Filed: Aug. 17, 2006

Related U.S. Application Data

(63) Continuation of application No. 10/734,138, filed on Dec. 15, 2003, now Pat. No. 7,166,412.

(30) Foreign Application Priority Data

Jun. 10, 2003 (KR) ............ 10-2003-0037040

(51) Int. Cl.
  *G03C 1/52* (2006.01)
  *G03C 1/735* (2006.01)
  *G03F 7/027* (2006.01)

(52) U.S. Cl. ............ 430/281.1; 430/285.1; 430/286.1; 430/287.1; 430/288.1; 430/325; 430/270.1

(58) Field of Classification Search ............ None
See application file for complete search history.

(56) References Cited

U.S. PATENT DOCUMENTS 7,166,412 B2 * 1/2007 Park et al. ............ 430/270.1
2004/0241590 A1  12/2004 Park et al.

OTHER PUBLICATIONS

Sudeep et al ("Fullerene-Functionalized Gold Nanoparticles. A Self-Assembled Photoactive Antenna-Metal Nanocore Assembly", Nano Letters, vol. 2(1), p. 29-35 (2002)).*
Lu et al ("Micropatterns Constructed from Au Nanoparticles", Chemical Communications, (9), p. 1056-1057 (2003)).*
Dr. G. Schon et al., A fascinating new field in colloid science: small ligand-stabilized metal clusters and possible application in microelectronics, Colliod Polym Sci (1995) 273, pp. 101-117, Steikopff-Verlag 1995, Essen, FRG.
Abraham Ulman, Formation and Structure of Self-Assembled Monolayers, Chem. Rev. 1996, American Chemical Society, pp. 1533-1554, Polytechnic University, Brooklyn, New York.
A.N. Goldstein et al., Melting in Semiconductor Nanocrystals, Report, Science, vol. 256, Jun. 5, 1992, pp. 1425-1427.
Chemical Abstract for Lu et al. ("Micropatterns Constructed from Au Nanoparticles", Chemical Communications, (9), pp. 1056-1057, (2003)).

* cited by examiner

*Primary Examiner*—Sin J. Lee
(74) *Attorney, Agent, or Firm*—Buchanan Ingersoll & Rooney PC

(57) ABSTRACT

A photosensitive metal nanoparticle and a method of forming a conductive pattern using the same, wherein a self-assembled monolayer of a thiol compound or isocyanide compound having a terminal reactive group is formed on a surface of the metal nanoparticle and a photosensitive group is introduced to the terminal reactive group. The photosensitive metal nanoparticles can easily form a conductive film or pattern having excellent conductivity upon exposure to UV, and thus can be applied for antistatic washable sticky mats or shoes, conductive polyurethane printer rollers, electromagnetic interference shielding, etc.

16 Claims, No Drawings

PHOTOSENSITIVE METAL NANOPARTICLE AND METHOD OF FORMING CONDUCTIVE PATTERN USING THE SAME

This non-provisional application is a continuation application of application Ser. No. 10/734,138 filed on Dec. 15, 2003 and claims priority under 35 U.S.C. § 119(a) from Korean Patent Application No. 2003-37040 filed on Jun. 10, 2003, which is herein incorporated by reference.

BACKGROUND OF THE INVENTION

1. Field of the Invention

The present invention relates, generally, to photosensitive metal nanoparticles and methods of forming conductive patterns using the same. More specifically, the present invention relates to a photosenstivie metal nanoparticle, produced by forming a self-assembled monolayer of a thiol or isocyanide compound having a terminal reactive group on its surface and introducing a photosensitive group through the terminal reactive group; and a method of forming a conductive pattern using the same.

2. Description of the Related Art

Nano-sized materials, having various electrical, optical and biological properties depending on the orders and spatial structures of one-, two- and three-dimensions, have been earnestly researched for a variety of fields all over the world. Among various types of the nano-sized materials, metal nano-particle can be used widely for various applications because, when metal is reduced to nano-size from its bulk state, metal nano particle has extremely large surface while there are very few metal atoms in the particle, and for this reason, metal nano-particle exhibits unique catalytic, electrical, photoelectric and magnetic properties [Science, 256, 1425 (1992) and Colloid Polymer. Sci. 273, 101 (1995)]. Metal nanoparticles, showing conductivity through an electroconductive mechanism of charge (or electron) transfer, have such a large specific surface area that, even when small amounts of the nanoparticles are used, their film or pattern can exhibit high conductivity. In addition, if packing is made more densely by controlling a particle size within a range of 3-15 nm, a charge transfer at interfaces of metals can be carried out more easily, resulting in higher conductivity.

With great advances in electronic industries, many attempts have been made to develop highly conductive films or patterns using various materials. In this regard, it is expected that metal nano particle can produce a high conductive film or pattern without performing an etching or sputtering process requiring high vacuum and/or high temperatures. Once being realized, preparation of a conductive film by using metal nano particle will be very useful because the film thus obtained can be transparent under visible rays by controlling particle size. However, for metal nano particles to be used in a form of film or pattern, there remains difficulties to overcome, i.e. controlling and arraying such fine particles efficiently.

For efficient arrays of the metal nanoparticles, there are a few proposed methods of using a self-assembled monolayer. The self-assembled monolayer is a layer formed on a surface of metal nanoparticle by arraying molecules of a compound having a functional group with chemical affinity to a specific metal and, its thickness can be controlled to the nano-scale, for example, from 10 to 40 nm. Generally, molecules of a compound having an amino group (—$NH_2$), an isocyanide group (—CN), or a thiol group (—SH) are arrayed on a nano-metal, such as gold, silver, copper, palladium, or platinum, to form a self-assembled monolayer [Chem. Rev. 96, 1533 (1996)].

However, in the case of using the self-assembled monolayer method, it is not easy to prepare metal nanoparticle films or patterns in a large size because of difficulty in controlling molecular orientation or spatial ordering, instability or aggregation of the metal nanoparticles in a thin film, and defects of film. For this reason, the metal nano particle or its film or pattern has been limited in their commercial application.

Therefore, in the art, there is a strong demand to develop a novel self-assembled nano structure that enables forming a large area film or pattern of the metal nanoparticles.

SUMMARY OF THE INVENTION

The present inventors devoted much effort to satisfying the demand in the prior art and found that when using photosensitive metal nano-particles that are prepared by forming a self-assembled monolayer of thiol (—SH) or isocyanide (—CN) compounds having a terminal reactive group on a surface of the metal nano-particles and introducing a photosensitive group through the reaction with the terminal reactive group to the monolayer, a pattern of the metal nanoparticles can be easily prepared over a large area via photolithography process, without performing sputtering or etching process.

Based on this founding, a first feature of an embodiment of the present invention is to provide metal nano particles that can easily prepare the large area film or pattern. Another preferred feature of the present invention is to provide a method of forming a pattern by using the photosensitive nano particles.

To achieve these and other features of various embodiments of the present invention, there is provided a photosensitive metal nanoparticle that is prepared by forming a self-assembled monolayer of a thiol (—SH) or isocyanide (—CN) compound having a terminal reactive group on a surface of the metal nano-particle and introducing a photosensitive group through the reaction with the terminal reactive group to the monolayer. Also, there is provided a composition comprising the above photosensitive metal nanoparticles, a photoinitiator, an organic solvent, and if necessary, a conductive polymer and/or a non-conductive polymer. Further, there is provided a method of forming a pattern using the above photosensitive composition.

DESCRIPTION OF THE PREFERRED EMBODIMENTS

Korean patent application No. 2003-37040, filed on Jun. 10, 2003, and entitled "Photosensitive Metal nanoparticle and Method of forming Conductive Pattern by using the same," is incorporated by reference herein in its entirely.

A photosensitive metal nanoparticle according to the present invention has a structure as shown schematically in the following, wherein a thiol or isocyanide compound coupled with a photosensitive end group forms a self-assembled monolayer on the metal nanoparticle:

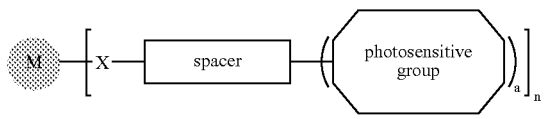

Wherein, M is a metal nanoparticle of gold, silver, copper, palladium, or platinum, whose diameter ranges 1-30 nm;

X is S or N≡C;

Spacer is a polyvalent organic group of 2-50 carbon atoms, and preferably, at least divalent organic group of 2-50 carbon atoms that can include —CONH—,

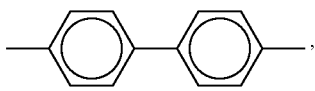

—COO—, —Si—, bis-(porphyrin) and/or —CO— in its carbon chain;

n is an integer of 1-500, preferably 1-100, more preferably 1-50;

a is an integer of 1-4; and the photosensitive group is an acryl group, an ethylene group or a diazo group.

The photosensitive metal nanoparticles of the present invention are prepared by (i) forming the self-assembled monolayer of a thiol or isocyanide compound with a terminal reactive group, represented by the following Formula 1, on the surface of the metal nanoparticle, and then (ii) introducing the photosensitive group through the reaction with the terminal reactive group to the monolayer:

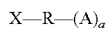   Formula 1

Wherein X— is HS— or NC—; R is a polyvalent organic group of 2-50 carbon atoms, and preferably, at least divalent organic group of 2-50 carbon atoms, that can include —CONH—, —COO—,

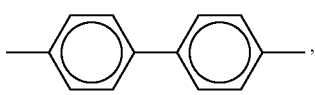

—Si—, bis-(porphyrin) and/or —CO— in the carbon chain; A is —OH, —COOH, —COCl or —NH$_2$; and a is an integer of 1-4.

Preferable examples of the thiol compound represented by Formula 1 include cystamine(dihydrochloride), 6-mercapto-1-hexanol, 2-mercaptoethanol, 4,4'-thiobiphenol, 1-mercapto-2-propanol, 3-mercapto-1-propanol, 3-mercapto-2-butanol, 3-mercapto-1,2-propanediol, 2,3-dimercapto-1-propanol, dithiotheretol, dithioerythritol, 1,4-dithio-L-theretol, 3-(methylthio)-1-propanol, 4-(methylthio)-1-butanol, 3-(methylthio)-1-hexanol, 2,2'-thiodiethanol, 2-hydroxyethyl disulfide, 3,6-dithia-1,8-octanediol, 3,3'-thiodipropanol, 3-methylthio-1,2-propanediol, 3-ethylthio-1,2-propanediol, D-glucose diethyl mercaptal, 1,4-dithiane-2,5-diol, 1,5-dithiacyclooctan-3-ol, or 4-hydroxythiophenol. Further, as a isocyanide compound (—N≡C) that are generally known to be easily coordinated with a metal through a sigma bond (Langumir, 14, 1684 (1998)), preferable examples in the present invention include 3-(benzylamino) propionitrile, 4-aminobenzyl cyanide, 4-cyanophenol, or 4'-hydroxy-4-biphenylcarbonitrile.

In a process of forming a self-assembled monolayer on the metal nanoparticle according to the present invention, the metal nanoparticles are dispersed in an organic solvent, along with the thiol compound or the isocyanide compound represented by Formula 1, followed by stirring for a predetermined period. In the present invention, the metal nanoparticles can be obtained by any known method and for example by the following method: An aqueous solution containing ions of a metal to be nano-sized (hereinafter, referred to as "target metal") is reduced with a reducing agent, such as citrate, EDTA, and NaBH$_4$, optionally in the presence of a surfactant including sodium oleate for stabilizing particles, thereby preparing desired metal nanoparticles. In cases of preparing copper nano-particles, an aqueous solution of copper hydrazine carboxylate (Cu(N$_2$H$_3$COO)$_2$.2H$_2$O) is refluxed at 70-90° C., and preferably, 80° C., thereby obtaining copper nanoparticles.

Also, if desired, nanoparticles inherently containing self-assembled monolayer can be obtained by the following method: an organic solution of the thiol or isocyanide compound of Formula 1 is reacted with an aqueous solution of a target metal ion in the presence of a phase transfer catalyst to obtain a dispersion of metal compounds surrounded by thiol compound or isocyanide compound molecules in the organic solution layer. Then the dispersion is treated with a reducing agent to precipitate the metal nanoparticles with self-assembled monolayer, which are subsequently subjected to a centrifugal process.

Metal nanoparticles, on a surface of which is formed self-assembled layer of a thiol or isocyanide compound with a terminal reactive group, are contacted with a reactive compound having photosensitive moiety to produce photosensitive metal nanoparticles according to the present invention. The reactive compound having photosensitive moiety includes not only a functional group to react with the terminal reactive group (A) at one end, end but also a photosensitive group, such as acryl group, ethylene group or diazo group at the other end. Examples of the reactive compound having photosensitive moiety include, but are not limited to, acrylochloride, acrylamide, acrylic acid, styrene, or derivatives of diazonium salts.

In the present invention, there is further provided a photosensitive composition including the above photosensitive metal nanoparticles, a photo-initiator, an organic solvent, and, if necessary, a conductive polymer and/or non-conductive polymer.

In the composition of the present invention, the photosensitive metal nanoparticles as mentioned above are used in various amounts, depending on the thickness and desired conductivity of a film or pattern, composition viscosity, or coating techniques. Preferable content of metal nanoparticles ranges 1-200 parts by weight based on 100 parts by weight of the organic solvent, but is not limited thereto.

The photo-initiator that can be used in the present invention includes any initiator initiating a radical polymerization by being decomposed by light, for example, acetophenone-, benzoin-, benzophenone-, or thioxatone-based compounds.

In the present invention, examples of the acetophenone-based initiator include 4-phenoxy dichloroacetophenone, 4-t-butyl dichloroacetophenone, 4-t-butyl trichloroacetophenone, diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl) ketone, 1-hydroxy cyclohexyl phenyl ketone, 2-methyl-1-[4-(methylthio)phenyl]-2-morpholino-propane-1-one, etc. The benzoin-based photoinitiator includes benzoin, benzoin methyl ether, benzoin ethyl ether, benzoin isopropyl ether, benzoin isobutyl ether, and benzyl dimethyl ketal. The benzophenone-based photoinitiator includes benzophenone, benzoyl benzoic acid, benzoyl benzoic acid methyl ester, 4-phenyl benzophenone, hydroxy benzophenone, 4-benzoyl-4'-methyl diphenyl sulfide, 3,3'-dimethyl-4-methoxy benzophenone, etc. The thioxatone-based compounds include thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, 2,4-diisopropylthioxanthone, etc.

In addition to the above initiators, 1-phenyl-1,2-propanedione-2-(O-ethoxycarbonyl)oxime, 2,4,6-trimethyl benzoyl diphenyl phosphine oxide, methyl phenyl glyoxylate, benzil, 9,10-phenanthra quinone, camphorquinone, dibenzosuberone, 2-ethylanthraquinone, 4,4'-diethylisophthalo phenone, or 3,3',4,4'-tetra(t-butylperoxycarbonyl)benzophenone may be used as the photo-initiator in the present invention. In particular, when a compound represented by the following Formulas 2 to 5, that is, a photo-initiator including a co-polymerizable functional group, is used, a level of a residual photo-initiator that remain un-reacted can be lowered so a more rigid patterns can be obtained:

Formula 2

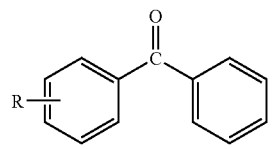

Wherein R is an acryl group;

Formula 3

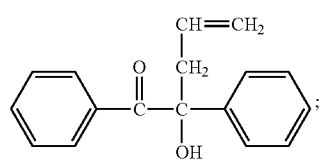

Formula 4

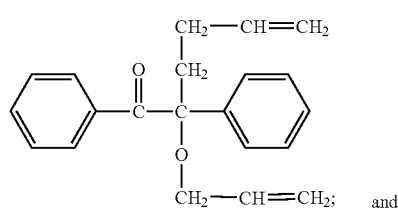

and

Formula 5

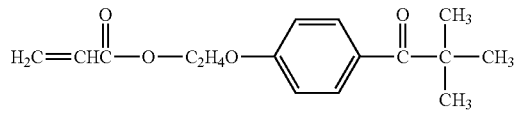

The amount of the photo-initiator is not particularly limited and is properly selected, considering an initiating ability, a film thickness, etc.

Besides the photo-initiator, there can be included a co-initiator in the composition of the present invention. Examples of the co-initiator includes, but are not limited to, triethanolamine, methyldiethanolamine, triisopropanol amine, 4,4'-dimethylamino benzophenone, 4,4'-diethylamino benzophenone, 2-dimethylamino ethylbenzoate, 4-dimethylamino ethylbenzoate, 2-n-butoxyethyl-4-dimethylaminobenzoate, 4-dimethylamino isoamylbenzoate, 4-dimethylamino-2-ethylhexyl benzoate, and Eosin Y. The amount of co-initiator used in the composition is not limited and, it can be varied depending on initiating ability, the thickness of the film, etc.

The organic solvent that can be used for the composition of the present invention includes, but is not limited to, DMF, 4-hydroxy-4-methyl-2-pentanone, ethylene glycol monoethyl ether and 2-methoxyethanol.

Also, as a binder, the composition of the present invention can include a conductive polymer and/or non-conductive polymer to afford uniformity or various functional abilities to the film when being polymerized by the exposure to light.

In the present invention, the conductive polymer is exemplified by polyacetylene (PA), polythiophene (PT), poly(3-alkyl)thiophene (P3AT), polypyrrole (PPY), poly-isothianapthelene (PITN), polyethylene dioxythiophene (PEDOT), polyparaphenylene vinylene (PPV), poly(2,5-dialkoxy)paraphenylenevinylene, polyparaphenylene (PPP), polyheptadiyne (PHT), poly(3-hexyl)thiophene (P3HT), polyaniline (PANI), and mixtures thereof. Number average molecular weight of the conductive polymer ranges from 1,000 to 30,000, and the polymer is used in the amount of 1-15 parts by weight, and preferably, 3-10 parts by weight, based on 100 parts by weight of the photosensitive metal nanoparticles. With the aim of obtaining a rigid film, an epoxy acrylate derivatives or commercially available epoxy compound having a glycidyl ether group may be over-coated.

The non-conductive polymer that can be used in the present invention includes polyester, polycarbonate, polyvinylalcohol, polyvinylbutyral, polyacetal, polyarylate, polyamide, polyamidimide, polyetherimide, polyphenylenether, polyphenylenesulfide, polyethersulfone, polyetherketone, polyphthalamide, polyethernitrile, polyethersulfone, polybenzimidazole, polycarbodiimide, polysiloxane, polymethylmethacrylate, polymethacrylamide, nitrile rubbers, acryl rubbers, polyethylenetetrafluoride, epoxy resins, phenol resins, melamine resins, urea resins, polybutene, polypentene, ethylene-propylene copolymer, ethylene-butene-diene copolymer, polybutadiene, polyisoprene, ethylene-propylene-diene copolymer, butyl rubbers, polymethylpentene, polystyrene, styrene-butadiene copolymer, hydrogenated styrene-butadiene copolymer, hydrogenated polyisoprene, hydrogenated polybutadiene, and mixtures thereof. The non-conductive polymer has a number average molecular weight ranging from 3,000 to 30,000, in consideration with solubility and coating ability, and is used in the amount of 0.1-10 parts by weight based on 100 parts by weight of the photosensitive metal nanoparticles.

The composition of the present invention is coated on the substrate, and exposed to light with or without a photomask having a desirable pattern, followed by a developing process. Thereby, without performing an additional sputtering or etching process, the conductive film or pattern can be simply formed.

The substrate that can be used in the present invention is not particularly limited, and can be selected in accordance with final use. Examples thereof include glass, silicon wafer and plastic. Coating of the composition can be accomplished by any of the conventional coating methods well known in the art. Non-limiting examples of the coating method useful in the present invention include spin-coating, dip-coating, spray-coating, flow-coating and screen-printing, while spin-coating is most preferred in light of convenience and film evenness. For spin coating, the spin rate is determined depending on viscosity of the coating composition, desired film thickness and desired conductivity, preferably between 200 and 3,500 rpm.

The coated composition is prebaked at 80-120° C., preferably, 100° C., for 1-2 min. to evaporate the solvent, followed by a whole exposure to light or a partial exposure under a photo-mask having a desirable pattern. Upon the exposure to light, the radical produced from the photo-initiator initiates the polymerization of the photosensitive groups introduced to the surface of the metal nanoparticles, whereby the metal nanoparticles are cross-linked. At a subsequent developing process, the cross-linked exposed portion becomes insoluble and has a drastically decreased solubility, compared with a non-exposed portion. Due to the difference of the solubility, only the exposed portion remains on the substrate after developing process, thus obtaining a desirable pattern. Types of a developer useful in the present invention are not limited and any organic developer commonly used in photolithography process can be adopted. DMF, 4-hydroxy-4-methyl-2-pentanone, ethylene glycol monoethyl ether, or 2-methoxyethanol can be preferably used as the developer for a better stability and uniformity of the film or pattern.

As for conducting films or patterns formed only with the conductive polymer, they might show pale green or brown color for a sufficient conductivity since their conducting properties stemmed from transfer of $\pi$ electrons of a double bond in a molecular chain so a lot of $\pi$ bonds, possibly causing a coloring problem, are required for higher conductivity. However, in the present invention, the film or pattern formed using the photosensitive metal nanoparticles is transparent under visible rays while it shows high conductivity.

According to the present invention, the photosensitive metal nanoparticles and the composition, if necessary being blended with the conductive polymer and/or non-conductive polymer, can be used commercially in the field of antistatic washable sticky mats, antistatic shoes, conductive polyurethane printer rollers, conductive wheels and industrial rollers, antistatic pressure sensitive adhesive films, EMI (Electro-Magnetic Interference shielding), etc. with success.

Hereinafter, the present invention will be described in more detail with the reference to the following Examples. However, these Examples are provided only for illustrative purposes, and are not to be construed as limiting the scope of the present invention.

Preparative Example 1

Preparation of Gold Nanoparticles 50 mM tetraoctylammonium bromide in 20 ml of toluene was added with 25 ml of hydrogen perculatorate ($HAuCl_4.H_2O$) solution (40 mM), and then stirred. To the reaction solution (orange color) was added 25 ml of an aqueous solution containing 0.4 g of $NaBH_4$, and then stirred for 2 hours to obtain a dark violet reaction mixture. After separation with an organic layer and an aqueous layer by leaving the reaction mixture, the organic layer was washed with 0.1 M sulfuric acid solution, 1 M sodium carbonate solution, and water, dried over $MgSO_4$, and filtered with a 0.45 μm PTFE syringe filter to obtain gold nano-particles. The particles thus obtained were dispersed in an organic toluene. Measurement by TEM (Transmission Electron Microscopy) of the dispersion shows that gold nanoparticles have an average size of 4-8 nm. From a centrifuge of the dispersion, pure gold nanoparticles were obtained.

Preparative Example 2

Preparation of Silver Nanoparticles

A solution prepared from 5 g of $AgNO_3$ and 0.1 $l$ of distilled water was added to 0.3 $l$ of an ice solution containing $2 \times 10^{-3}$ M sodium borohydride ($NaBH_4$), and stirred for 2 hours for reaction. The reaction mixture was centrifuged to separate a supernatant and slurry thus obtained was dried over $MgSO_4$, poured with toluene, and filtered with a 0.45 μm PTFE syringe filter to obtain nano-particles. The particles thus obtained were dispersed in an organic toluene. Measurement by TEM of the dispersion shows that silver nanoparticles have an average size of 4-8 nm. From a centrifuge of the dispersion, pure silver nanoparticles were obtained.

Preparative Example 3

Preparation of Copper Nanoparticles 300 mg of copper hydrazine carboxylate (CHC) prepared from cupric chloride and hydrazine carboxylic acid ($N_2H_3COOH$) was dissolved in 100 ml of distilled water, and refluxed at 80° C. for 3 hours in a nitrogen atmosphere for reaction. As such, a color change of the solution from blue to red showed the presence of metallic copper in the solution. The reaction mixture was centrifuged and pure copper nanoparticles were separated from the supernatant. The particles thus obtained were dispersed in an organic toluene. Measurement by TEM of the dispersion shows that copper nanoparticles have an average size of 4-8 nm.

Preparative Example 4

Preparation of Palladium Nanoparticles

Hydrazine ($N_2H_4$) (40 mM, 10 ml) was added dropwise to a 100 ml yellowish solution of $Na_2PdCl_4$ (5 mM, 15 ml), and then the reaction went for 3 hours, to obtain a brown dispersion of palladium nanoparticles, which underwent then centrifuge and pure palladium nanoparticles were separated from the supernatant. The particles thus obtained were dispersed in an organic toluene. Measurement by TEM of the dispersion shows that palladium nanoparticles have an average size of 3-10 nm.

Preparative Example 5

Preparation of Platinum Nanoparticles 5 ml of 0.06 M $NaBH_4$ and 10 ml of 0.0033 M hydrogen hexachloroplatinate (VI) hexahydrate ($H_2PtCl_6.6H_2O$) were mixed with stirring, and reacted for 2 hours, to obtain a dark brown dispersion. The dispersion thus obtained was allowed to stand to separate an organic layer from an aqueous layer. The separated organic layer was dried over $MgSO_4$ and filtered with a 0.45 μm PTFE syringe filter, resulting in obtaining platinum nanoparticles having an average size of 2-5 nm (TEM measurement).

Example 1

Introduction of Photosensitive group to Surface of Gold Nanoparticles 0.2 g of the gold nanoparticles prepared in Preparative Example 1 was dispersed in 5 g of cystamine dihydrochloride, and stirred by use of a magnetic bar for 2 hours, filtered, and then washed with pure water and filtered, to obtain gold nanoparticles each having a surface substituted with amine groups. While the pH being maintained at 7.2-7.4 in a buffer solution of 0.05 M 4-(2-hydroxyethyl)-1-piperrazineethanesulfonic acid (HEPES), the gold nanoparticles were reacted with acrylic acid (0.01 M) for 4 hours, in the presence of 1-ethyl-3(3-dimethylaminopropyl)carbodiimide (EDC) as a condensation reaction agent. After the completion of the reaction, resulting metal nanoparticles were filtered, washed twice with THF, and dried under a reduced pressure, to yield photosensitive metal nanoparticles having acryl moieties connected through an amide group on the surface thereof.

Example 2

Introduction of Photosensitive group to Surface of Silver Nanoparticles

Silver nanoparticles having acryl moieties connected through an amide group on the surface thereof were obtained in the same manner as in Example 1, with the exception that 0.2 g of the silver nanoparticles prepared in Preparative Example 2 was used, instead of the gold nanoparticles.

Example 3

Introduction of Photosensitive group to Surface of Copper Nanoparticles

Copper nanoparticles having acryl moieties connected through an amide group on the surface thereof were obtained in the same manner as in Example 1, with the exception that 0.2 g of the copper nanoparticles prepared in Preparative Example 3 was used, instead of the gold nanoparticles.

Example 4

Introduction of Photosensitive group to Surface of Palladium Nanoparticles

Palladium nanoparticles having acryl moieties connected through an amide group on the surface thereof were obtained in the same manner as in Example 1, with the exception that 0.2 g of the palladium nanoparticles prepared in Preparative Example 4 was used, instead of the gold nanoparticles.

Example 5

Introduction of Photosensitive group to Surface of Platinum Nanoparticles

Platinum nanoparticles having acryl moieties connected through an amide group on the surface thereof were obtained in the same manner as in Example 1, with the exception that 0.2 g of the platinum nanoparticles prepared in Preparative Example 5 was used, instead of the gold nanoparticles.

Example 6

Introduction of Photosensitive group to Surface of Gold Nanoparticles 0.2 g of the gold nanoparticles prepared in Preparative Example 1 was dispersed in 50 ml of 1:1 mixture of conc. sulfuric acid and 30% hydrogen peroxide, and slowly stirred for 20 min. Then, the dispersion was diluted with 250 ml of distilled water, filtered with a 0.2 μm filter, washed five times with 50 ml of methanol, and dried in an oven at 160° C. for 5 hours. 0.1 g of the dried gold nanoparticles together with 1.3 g of 4-cyanophenol was added to 200 ml of toluene, and stirred for 72 hours. The resulting product was filtered with a 0.2 μm filter, washed twice with THF, and dried under a reduced pressure in an oven at 30° C., to obtain gold nanoparticles each having a self-assembled monolayer of 4-cyanophenol thereon. 0.1 g of the gold nanoparticles were added to 200 ml of THF, and ultrasonicated for 20 min and thus dispersed. To the resultant dispersion was added 1.5 ml of triethylamine and stirred for 30 min in a nitrogen atmosphere. Further, 3 ml of acrylochloride was added to the stirred reaction solution, and reacted for 12 hours while the reaction temperature was maintained at 0° C. After the completion of the reaction, the product was washed twice with a dilute ammonium hydroxide solution and water, and then twice with THF, followed by filtering by use of a 0.2 μm filter and drying under a reduced pressure in an oven at 30° C. for 5 hours, thereby preparing gold nanoparticles on which an acryl group is substituted.

Example 7

Direct Preparation of Gold Nanoparticles Having Self-Assembled Monolayer and Introduction of Photosensitive Group to Surface Thereof To a solution of 1.6 g of tetraoctylammonium bromide in 400 ml of toluene was added 0.5 g of hydrogen tetrachlourate in 150 ml of distilled water, and stirred for 2 hours. To the resulting solution was added dropwise a solution of 0.2 ml of 6-mercapto-1-hexanol in 50 ml of toluene for 30 min, and stirred for 4 hours. To the reaction mixture was further added 0.55 g of $NaBH_4$, stirred for 4 hours, filtered with a 0.2 μm filter, and dried under a reduced pressure in an oven at 30° C. for 5 hrs, to prepare gold nanoparticles each having a self-assembled monolayer of 6-mercapto-1-hexanol thereon. 0.2 g of the gold nanoparticles were added to 300 ml of THF, and ultrasonicated for 30 min. To the resulting dispersion was added 1.2 ml of triethylamine and stirred for 30 min in a nitrogen atmosphere. Further, 3 ml of acrylochloride was added to the stirred reaction dispersion, and the reaction went for 12 hours while the temperature was maintained at 0° C. After the completion of the reaction, the product was washed twice with a dilute ammonium hydroxide solution and water, and then twice with THF, followed by filtering by use of a 0.2 µm filter and drying under a reduced pressure in an oven at 30° C. for 5 hours, thereby obtaining gold nanoparticles on which an acryl group is substituted.

Example 8

Formation of Negative Pattern Using Photosensitive Metal Nanoparticles and Measurement of Conductivity Coating solutions were prepared respectively, comprising 0.1 g of respective photosensitive metal nanoparticles prepared in Examples 1 to 7, 0.0005 g of Irgacure 907 purchased from Ciba Specialty Chemicals Inc. as a photoinitiator, and 1.5 g of propyleneglycol methyletheracetate (PGMEA) as a solvent. Each coating solution was ultra-sonicated for 1 hour to mix sufficiently each component in the coating solution, and then filtered with a 0.5 µm syringe, followed by a spin coating process at 300-500 rpm on a silicon wafer and a drying process at 100° C. for 1 min to remove the solvent remaining on the coated surface. Each film thus obtained was exposed to ultraviolet rays at 600 mJ/cm$^2$ under a photo-mask formed with a desired pattern, and developed in DMF (developer) for 10 sec, to obtain a pattern line of photosensitive metal nanoparticles in a resolution range of 30-60 µm. Conductivity was measured by calculating a thickness by use of a 4-point probe. The results are shown in Table 1, below.

TABLE 1

| Sample | Conductivity (S/cm) | Pattern Resolution (µm) |
|---|---|---|
| Ex. 1 | 35 | 40 |
| Ex. 2 | 30 | 50 |
| Ex. 3 | 25 | 50 |
| Ex. 4 | 20 | 60 |
| Ex. 5 | 25 | 35 |
| Ex. 6 | 38 | 40 |
| Ex. 7 | 32 | 50 |

From Table 1, it can be seen that the use of the photosensitive metal nanoparticles of the present invention results in the formation of the pattern having high resolution and conductivity even without performing an etching process.

Example 9

Preparation of Conductive Film

Coating solutions were prepared respectively, comprising 0.1 g of respective photosensitive metal nanoparticles prepared in Examples 1 to 7, 0.05 g of polythiophene (PT) 3% DMF as a conductive polymer, 0.0002 g of Irgacure 651 purchased from Ciba Specialty Chemicals Inc. as a photoinitiator, and 1.5 g of PGMEA as a solvent. Each coating solution was ultrasonicated for 1 hour to sufficiently mix components of the coating solution, and then filtered with a 0.5 µm syringe, followed by a spin coating process at 500 rpm on a silicon wafer and a drying process at 100° C. for 1 min to remove the solvent remaining on the coated surface. Each film thus obtained was wholly exposed to light at 600 mJ/cm$^2$ without a photo mask, to prepare a conductive film. Conductivity was measured by calculating a thickness by use of a Jandal Universal 4 point probe. The results are shown in Table 2, below.

Example 10

Preparation of Conductive Film

A conductive film was prepared in the same manner as in Conductive Film Preparation 1, with the exception that 0.001 g of polystyrene (PS) having a number average molecular weight of 5,000 was used as a polymer binder, instead of polythiophene, and 1.0 g of PGMEA and 0.3 g of toluene were used as a solvent. Conductivity was measured, and the results are shown in Table 2, below.

TABLE 2

| Example 9 | Conductivity (S/cm) | Example 10 | Conductivity (S/cm) |
|---|---|---|---|
| Ex. 1 + PT | 38 | Ex. 1 + PS | 30 |
| Ex. 2 + PT | 34 | Ex. 2 + PS | 25 |
| Ex. 3 + PT | 28 | Ex. 3 + PS | 22 |
| Ex. 4 + PT | 25 | Ex. 4 + PS | 16 |
| Ex. 5 + PT | 28 | Ex. 5 + PS | 21 |
| Ex. 6 + PT | 42 | Ex. 6 + PS | 32 |
| Ex. 7 + PT | 35 | Ex. 7 + PS | 24 |

From Table 2, it can be seen that when the photosensitive metal nanoparticles of the present invention are mixed with the conductive polymer, the resulting film has high conductivity. Further, even when the photosensitive metal nanoparticles are mixed with a general polymer, the film shows relatively high conductivity.

The photosensitive metal nanoparticles of the present invention can be easily formed into a conductive film or pattern by exposure to light followed by photopolymerization, and the resulting film or pattern is excellent in conductivity. Therefore, photosensitive metal nanoparticles of the present invention can be used in the fields of antistatic washable sticky mats, antistatic shoes, conductive polyurethane printer rollers, conductive wheels and industrial rollers, antistatic pressure sensitive adhesive films, electromagnetic interference shielding, etc.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A photosensitive metal nanoparticle prepared by (i) forming a self-assembled monolayer of a thiol or isocyanide compound with a terminal reactive group, represented by Formula 1, on the surface of the metal nanoparticle, and then (ii) introducing a photosensitive group through a reaction with the terminal reactive group to the monolayer:

   Formula 1 wherein X— is HS— or NC—; R is a polyvalent organic group of 2-50 carbon atoms; A is —OH, —COOH, —COCl or —NH$_2$; and a is an integer of 1-4, wherein the nanoparticle is polymerizable upon UV exposure.

2. The metal nanoparticle of claim 1, wherein the metal nanoparticle comprises gold, silver, copper, palladium, or platinum;

R of Formula 1 is polyvalent organic group of 2-50 carbon atoms, that can include —CONH—,

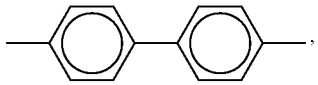

—COO—, —Si—, bis-(porphyrin) and/or —CO— in its carbon chain;

the photosensitive group is an acryl group, an ethylene group, or a diazo group.

3. The metal nanoparticle of claim 2, wherein the thiol compound is selected from the group consisting of cystamine (dihydrochloride), 6-mercapto-1-hexanol, 4,4'-thiobiphenol, 2-mercaptoethanol, 1-mercapto-2-propanol, 3-mercapto-1-propanol, 3-mercapto-2-butanol, 3-mercapto-1,2-propanediol, 2,3-dimercapto-1-propanol, dithiotheretol, dithioerythritol, 1,4-dithio-L-theretol, 3-(methylthio)-1-propanol, 4-(methylthio)-1-butanol, 3-(methylthio)-1-hexanol, 2,2'-thiodiethanol, 2-hydroxyethyl disulfide, 3,6-dithia-1,8-octanediol, 3,3'-thiodipropanol, 3-methylthio-1,2-propanediol, 3-ethylthio-1,2-propanediol, D-glucose diethyl mercaptal, 1,4-dithiane-2,5-diol, 1,5-dithiacyclooctan-3-ol, and 4-hydroxythiophenol; and the isocyanide compound is selected from the group consisting of 4-aminobenzyl cyanide, 4-cyanophenol, and 4'-hydroxy-4-biphenylcarbonitrile.

4. The metal nanoparticle of claim 1, wherein the thiol compound is selected from the group consisting of cystamine (dihydrochloride), 6-mercapto-1-hexanol, 4,4'-thiobiphenol, 2-mercaptoethanol, 1-mercapto-2-propanol, 3-mercapto-1-propanol, 3-mercapto-2-butanol, 3-mercapto-1,2-propanediol, 2,3-dimercapto-1-propanol, dithiotheretol, dithioerythritol, 1,4-dithio-L-theretol, 3-(methylthio)-1-propanol, 4-(methylthio)-1-butanol, 3-(methylthio)-1-hexanol, 2,2'-thiodiethanol, 2-hydroxyethyl disulfide, 3,6-dithia-1,8-octanediol, 3,3'-thiodipropanol, 3-methylthio-1,2-propanediol, 3-ethylthio-1,2-propanediol, D-glucose diethyl mercaptal, 1,4-dithiane-2,5-diol, 1,5-dithiacyclooctan-3-ol, and 4-hydroxythiophenol; and the isocyanide compound is selected from the group consisting of 4-aminobenzyl cyanide, 4-cyanophenol, and 4'-hydroxy-4-biphenylcarbonitrile.

5. The metal nanoparticle of claim 1, wherein, in step (ii), a reactive compound comprises the photosensitive group and a functional group and the functional group reacts with the terminal reactive group to the monolayer.

6. The metal nanoparticle of claim 1, wherein the photosensitive group is covalently bonded to the monolayer.

7. A photosensitive metal nanoparticle prepared by (i) forming a self-assembled monolayer of a thiol or isocyanide compound with a terminal reactive group, represented by Formula 1, on the surface of the metal nanoparticle, and then (ii) introducing a photosensitive group through a reaction with the terminal reactive group to the monolayer:

X—R—(A)$_a$   Formula 1 wherein X— is HS— or NC—; R is an at least divalent organic group of 2-50 carbon atoms; A is —OH, —COOH, —COCl or —NH$_2$; and a is an integer of 1-4, wherein the nanoparticle is polymerizable upon UV exposure.

8. The metal nanoparticle of claim 7, wherein, in step (ii), a reactive compound comprises the photosensitive group and a functional group and the functional group reacts with the terminal reactive group to the monolayer.

9. The metal nanoparticle of claim 7, wherein the photosensitive group is covalently bonded to the monolayer.

10. A photosensitive metal nanoparticle prepared by (i) forming a self-assembled monolayer of a thiol or isocyanide compound with a terminal reactive group, represented by Formula 1, on the surface of the metal nanoparticle, and then (ii) introducing a photosensitive group through a reaction with the terminal reactive group to the monolayer, wherein the photosensitive group is a polymerizable group:

X—R—(A)$_a$   Formula 1 wherein X— is HS— or NC—; R is a polyvalent organic group of 2-50 carbon atoms; A is —OH, —COOH, —COCl or —NH$_2$; and a is an integer of 1-4, wherein the nanoparticle is polymerizable upon UV exposure.

11. The metal nanoparticle of claim 10, wherein the metal nanoparticle comprises gold, silver, copper, palladium, or platinum;

R of Formula 1 is polyvalent organic group of 2-50 carbon atoms, that can include —CONH—,

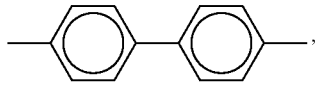

—COO—, —Si—, bis-(porphyrin) and/or —CO— in its carbon chain;

the photosensitive group is an acryl group, an ethylene group, or a diazo group.

12. The metal nanoparticle of claim 11, wherein the thiol compound is selected from the group consisting of cystamine (dihydrochloride), 6-mercapto-1-hexanol, 4,4'-thiobiphenol, 2-mercaptoethanol, 1-mercapto-2-propanol, 3-mercapto-1-propanol, 3-mercapto-2-butanol, 3-mercapto-1,2-propanediol, 2,3-dimercapto-1-propanol, dithiotheretol, dithioerythritol, 1,4-dithio-L-theretol, 3-(methylthio)-1-propanol, 4-(methylthio)-1-butanol, 3-(methylthio)-1-hexanol, 2,2'-thiodiethanol, 2-hydroxyethyl disulfide, 3,6-dithia-1,8-octanediol, 3,3'-thiodipropanol, 3-methylthio-1,2-propanediol, 3-ethylthio-1,2-propanediol, D-glucose diethyl mercaptal, 1,4-dithiane-2,5-diol, 1,5-dithiacyclooctan-3-ol, and 4-hydroxythiophenol; and the isocyanide compound is selected from the group consisting of 4-aminobenzyl cyanide, 4-cyanophenol, and 4'-hydroxy-4-biphenylcarbonitrile.

13. The metal nanoparticle of claim 10, wherein the thiol compound is selected from the group consisting of cystamine (dihydrochloride), 6-mercapto-1-hexanol, 4,4'-thiobiphenol, 2-mercaptoethanol, 1-mercapto-2-propanol, 3-mercapto-1-propanol, 3-mercapto-2-butanol, 3-mercapto-1,2-propanediol, 2,3-dimercapto-1-propanol, dithiotheretol, dithioerythritol, 1,4-dithio-L-theretol, 3-(methylthio)-1-propanol, 4-(methylthio)-1-butanol, 3-(methylthio)-1-hexanol, 2,2'-thiodiethanol, 2-hydroxyethyl disulfide, 3,6-dithia-1,8-octanediol, 3,3'-thiodipropanol, 3-methylthio-1,2-propanediol, 3-ethylthio-1,2-propanediol, D-glucose diethyl mercaptal, 1,4-dithiane-2,5-diol, 1,5-dithiacyclooctan-3-ol, and 4-hydroxythiophenol; and the isocyanide compound is selected from the group consisting of 4-aminobenzyl cyanide, 4-cyanophenol, and 4'-hydroxy-4-biphenylcarbonitrile.

14. A photosensitive metal nanoparticle prepared by (i) forming a self-assembled monolayer of a thiol or isocyanide compound with a terminal reactive group, represented by Formula 1, on the surface of the metal nanoparticle, and then (ii) introducing a photosensitive group through a reaction with the terminal reactive group to the monolayer, wherein the photosensitive group is a polymerizable group:

X—R—(A)$_a$     Formula 1 wherein X— is HS— or NC—; R is a polyvalent organic group of 2-50 carbon atoms; A is —OH, —COOH, —COCl or —NH$_2$; and a is an integer of 1-4, wherein the photosensitive group is covalently bonded to the monolayer.

15. A photosensitive metal nanoparticle prepared by (i) forming a self-assembled monolayer of a thiol or isocyanide compound with a terminal reactive group, represented by Formula 1, on the surface of the metal nanoparticle, and then (ii) introducing a photosensitive group through a reaction with the terminal reactive group to the monolayer, wherein the photosensitive group is a polymerizable group:

X—R—(A)$_a$     Formula 1 wherein X— is HS— or NC—; R is an at least divalent organic group of 2-50 carbon atoms; A is —OH, —COOH, —COCl or —NH$_2$; and a is an integer of 1-4, wherein the photosensitive group is covalently bonded to the monolayer.

16. A photosensitive metal nanoparticle prepared by (i) forming a self-assembled monolayer of a thiol or isocyanide compound with a terminal reactive group, represented by Formula 1, on the surface of the metal nanoparticle, and then (ii) introducing a photosensitive group through a reaction with the terminal reactive group to the monolayer, wherein the photosensitive group is a polymerizable group:

X—R—(A)$_a$     Formula 1 wherein X— is HS— or NC—; R is an at least divalent organic group of 2-50 carbon atoms; A is —OH, —COOH, —COCl or —NH$_2$; and a is an integer of 1-4, wherein the nanoparticle is polymerizable upon UV exposure.

* * * * *